United States Patent
Cody et al.

(10) Patent No.: US 7,785,995 B2
(45) Date of Patent: Aug. 31, 2010

(54) SEMICONDUCTOR BUFFER STRUCTURES

(75) Inventors: Nyles W. Cody, Tempe, AZ (US); Chantal Arena, Mesa, AZ (US); Pierre Tomasini, Tempe, AZ (US); Carlos Mazure, Bernjn (FR)

(73) Assignees: ASM America, Inc., Phoenix, AZ (US); S.O.I. Tec Silicon on Insulator Technologies, S.A., Bernin (FR)

( * ) Notice: Subject to any disclaimer, the term of this patent is extended or adjusted under 35 U.S.C. 154(b) by 639 days.

(21) Appl. No.: 11/431,336

(22) Filed: May 9, 2006

(65) Prior Publication Data

US 2007/0264801 A1    Nov. 15, 2007

(51) Int. Cl.
H01L 21/28 (2006.01)

(52) U.S. Cl. .................. 438/572; 438/590; 438/602; 438/767; 257/19; 257/190; 257/E21.102; 257/E21.103; 257/E21.129; 117/89

(58) Field of Classification Search .......... 438/483, 438/285, 518, 572, 590, 602, 718, 767, 779, 438/796; 257/19, 20, 190, 192, E21.102, 257/E21.125, E21.129; 117/89
See application file for complete search history.

(56) References Cited

U.S. PATENT DOCUMENTS

| | | | |
|---|---|---|---|
| 5,442,205 A | 8/1995 | Brasen et al. | |
| 5,445,897 A | 8/1995 | Satoh et al. | |
| 5,633,516 A | 5/1997 | Mishima et al. | |
| 5,847,409 A | 12/1998 | Nakayama | |
| 6,154,475 A | 11/2000 | Soref et al. | |
| 6,350,993 B1 | 2/2002 | Chu et al. | |
| 6,525,338 B2 | 2/2003 | Mizushima et al. | |
| 6,573,126 B2 | 6/2003 | Cheng et al. | |
| 6,953,736 B2 | 10/2005 | Ghyselen et al. | |
| 7,022,593 B2 | 4/2006 | Arena et al. | |
| 7,049,627 B2* | 5/2006 | Vineis et al. | 257/18 |
| 7,390,725 B2 | 6/2008 | Maa et al. | |
| 7,402,504 B2* | 7/2008 | Brabant et al. | 438/481 |
| 2003/0153161 A1 | 8/2003 | Chu et al. | |
| 2003/0157787 A1 | 8/2003 | Murthy et al. | |
| 2003/0230233 A1 | 12/2003 | Fitzgerald et al. | |
| 2004/0075105 A1 | 4/2004 | Leitz et al. | |
| 2004/0087117 A1 | 5/2004 | Leitz et al. | |
| 2004/0157409 A1 | 8/2004 | Ghyselen et al. | |

(Continued)

FOREIGN PATENT DOCUMENTS

EP     1 681 711     7/2006

OTHER PUBLICATIONS

Bolkhovityanov et al., "Artificial GeSi Substrates for Heteroepitaxy: Achievements and Problems," *Semiconductors* 37(5): 493-518 (2003).

(Continued)

*Primary Examiner*—Matthew C Landau
*Assistant Examiner*—Colleen E Snow
(74) *Attorney, Agent, or Firm*—Knobbe Martens Olson & Bear LLP

(57) ABSTRACT

Pile ups of threading dislocations in thick graded buffer layer are reduced by enhancing dislocation gliding. During formation of a graded SiGe buffer layer, deposition of SiGe from a silicon precursor and a germanium precursor is interrupted one or more times with periods in which the flow of the silicon precursor to the substrate is stopped while the flow of the germanium precursor to the substrate is maintained.

33 Claims, 6 Drawing Sheets

U.S. PATENT DOCUMENTS

| | | |
|---|---|---|
| 2004/0178406 A1 | 9/2004 | Chu |
| 2004/0192002 A1* | 9/2004 | Soman et al. ............... 438/312 |
| 2004/0219735 A1 | 11/2004 | Brabant et al. |
| 2005/0051795 A1 | 3/2005 | Arena et al. |
| 2005/0054175 A1 | 3/2005 | Bauer |
| 2005/0150447 A1 | 7/2005 | Ghyselen et al. |
| 2005/0170577 A1 | 8/2005 | Yao et al. |
| 2005/0191826 A1 | 9/2005 | Bauer et al. |
| 2006/0145188 A1 | 7/2006 | Dantz et al. |
| 2006/0211230 A1 | 9/2006 | Figuet |
| 2007/0048956 A1* | 3/2007 | Dip et al. .................... 438/312 |
| 2007/0051975 A1 | 3/2007 | Figuet et al. |

OTHER PUBLICATIONS

Fitzgerald et al., "Totally Relaxed $Ge_xSi_{1-x}$ Layers with Low Threading Dislocation Densities Grown on Si Substrates," *Appl. Phys. Lett.* 59(7):811-813 (1991).

Obata et al., "Structural Characterization of $Si_{0.7}Ge_{0.3}$ Layers Grown on Si(001) Substrates by Molecular Beam Epitaxy," *J. Appl. Phys.* 81(1): 199-204 (1997).

Yamamoto et al., "Dislocation Structures and Strain-Relaxation in SiGe Buffer Layers on Si (0 0 1) Substrates with an Ultra-Thin Ge Interlayer," *Appl. Surface Sci.* 224: 108-112 (2004).

Isella et al., "Low-energy plasma-enhanced chemical vapor deposition for strained Si and Ge heterostructures and devices" Solid State Electronics, Elsevier Science Publishers, Barking, GB, vol. 48, No. 8, Aug. 2004, pp. 1317-1323.

Presting et al., "Buffer Concepts of Ultrathin Simgen Superlattices" Thin Solid Films, Elsevier-Sequoia S.A. Lausanne, CH, vol. 222, No. ½, Dec. 20, 1992, pp. 215-220.

International Preliminary Report on Patentability for PCT/US2007/008879 mailed Nov. 20, 2008.

Levinshtein, Michael E., Rumyantsev, Sergey L, and Shur, Michael S., *Properties of Advanced Semiconductor Materials GaN, AlN, InN, BN, SiC, SiGe*, John Wiley & Sons, Inc., 149-187 (2001).

Pending U.S. Appl. No. 11/267,494 entitled: Semiconductor Heterostructure and Method for Forming a Semiconductor Heterostructure, Filed on Mar. 11, 2005 by Christophe Figuet and Mark Kennard.

Pending U.S. Appl. No., 11/146,572 entitled: Laminated Layer Structure and Method for Forming the Same, Filed on Jun. 6, 2005 by Christophe Figuet.

* cited by examiner

SEMICONDUCTOR BUFFER STRUCTURES

BACKGROUND OF THE INVENTION

1. Field of the Invention

The present invention relates generally to the formation of strained semiconductor layers in the field of semiconductor manufacturing, and relates specifically to the formation of strained silicon on silicon germanium buffer layers.

2. Description of the Related Art

Strained semiconductor materials advantageously provide improved electrical carrier mobility properties as compared to relaxed semiconductor materials, thus increasing the speed at which semiconductor circuits can operate. A semiconductor layer is said to be "strained" when it is constrained to have a lattice structure in at least two dimensions that is the same as that of the underlying single crystal substrate, but different from its inherent lattice constant. Lattice strain occurs because the atoms in the deposited film depart from the positions normally occupied when the material is deposited over an underlying structure having a matching lattice structure. The degree of strain is related to several factors, including the thickness of the deposited layer and the degree of lattice mismatch between the deposited material and the underlying structure.

Strained semiconductor layers can be formed by epitaxially depositing silicon over a silicon germanium buffer layer. Silicon germanium films are used in a wide variety of semiconductor applications, such as in microelectronics fabrication. Because SiGe has a larger lattice constant than silicon, when epitaxial SiGe deposition occurs over silicon (such as during deposition on a silicon wafer), the epitaxially deposited SiGe is "strained" to the smaller underlying silicon lattice. If a strained silicon layer is to be deposited over the SiGe layer, the SiGe buffer layer should first be "relaxed" so that the silicon layer deposited thereover will be strained. In particular, because a strained SiGe layer has the dimensions of the underlying silicon lattice, a silicon layer deposited over a strained SiGe layer will not be strained. In contrast, a silicon layer deposited over a "relaxed" SiGe layer will be strained to conform to the larger underlying SiGe lattice. Thus, a strained silicon layer can be produced by epitaxially depositing silicon over a relaxed SiGe layer.

There are a number of approaches to forming a relaxed SiGe layer over silicon. In one approach, a SiGe layer is deposited beyond the "critical thickness." As the thickness of a strained SiGe layer increases beyond a certain "critical thickness", defects in the crystal structure of the strained SiGe layer appear, thereby inducing relaxation. After relaxation occurs, the degree of strain present in the SiGe layer is related to the amount of misfit dislocation generated in the layer during relaxation, which is a function of the elastic energy of the layer and the activation energy for dislocation nucleation and gliding. The critical thickness depends on a variety of factors, including growth rates, growth temperature, germanium concentration, and the number of defects within the layer underlying the SiGe layer.

In another approach, a graded SiGe buffer layer is deposited, with an increasing concentration of Ge from the underlying Si to the top surface. Unfortunately, when a thick graded buffer ("TGB") structure is grown, relaxation is often accompanied by vertically propagating threading dislocations and misfit dislocations. This occurs as a result of the lattice mismatch between the silicon substrate and the SiGe. Threading dislocations that are formed in the buffer layer propagate up into the overlying layer of strained semiconductor material, typically strained silicon, which can adversely affect device operation. Additionally, the surface of the graded buffer structure roughens as a function of the composition, leading to very high RMS surface roughness values.

By using various techniques during grading of the TGB structure, these deleterious effects can be reduced. For example, it has been shown that a linear change in germanium concentration at a grade rate of about 10% per micron produces a reduced defect level. While this method may be an improvement, the layers still suffer from a large number of threading dislocations and pile ups (a conglomeration of threading dislocations). Defect density for this method has been reported to be in the range of about $10^5/cm^2$ for threading dislocations and pile up counts in excess of 20/cm (Fitzgerald et al. Applied Physics Lett. 69 (7) 811, 1991). In addition, the layers still have a high roughness. Other examples of methods that have been tried to reduce defects include the use of strained super lattice structures to pin the threading dislocations (Obata et al. J. Appl. Phys. 81,199 (1997)) and the insertion of constant composition layers to pin threading dislocations at the interface.

SUMMARY OF THE INVENTION

In one aspect, the present invention relates to methods of forming a SiGe layer over a semiconductor substrate by a vapor deposition process, preferably a chemical vapor deposition (CVD) process, using vapor phase silicon and germanium precursors. Defects in the buffer layer are reduced by interrupting the flow of the silicon precursor at one or more intervals during deposition.

In some embodiments, a silicon precursor and a germanium precursor are flowed into a reaction space to deposit SiGe on a substrate in a first SiGe deposition phase. The flow of the silicon precursor into the reaction chamber is interrupted in a first interruption phase, while the germanium precursor continues to flow. The interruption phase preferably continues for less than about 10 seconds, more preferably less than about 5 seconds, after which the flow of the silicon precursor is resumed in a second SiGe deposition phase. The interruption phase results in the formation of an interface layer in the SiGe layer. Preferably the interface has a thickness of less than about 100 Å, more preferably less than about 50 Å and has a composition that differs from the overlying and underlying SiGe layer. In some embodiments two or more interruption phases are provided in the course of depositing the SiGe buffer layer. In some embodiments the SiGe deposited during the first and/or second SiGe deposition phases comprises an increasing concentration of germanium.

In another aspect of the invention, methods are provided in which a SiGe buffer layer with reduced defects is deposited on a substrate by continuously flowing a germanium precursor to a reaction chamber containing the substrate and intermittently flowing a silicon precursor to the reaction chamber. In some embodiments, the SiGe buffer layer preferably comprises an increasing concentration of germanium from an interface with the substrate to an interface with an overlying layer, such as a strained silicon layer.

In a further aspect, methods of forming a strained silicon layer on a substrate are provided. A SiGe buffer layer is preferably deposited on a substrate by a CVD process and a layer of strained silicon is deposited over the buffer layer. The CVD process preferably comprises at least one SiGe deposition phase, in which the substrate is contacted with a vapor phase silicon compound and a vapor phase germanium compound to deposit SiGe with an increasing Ge concentration, and at least one interruption phase, in which the substrate is contacted with a vapor phase germanium compound but not a vapor phase silicon compound. In some embodiments, during the SiGe deposition phase the concentration of the vapor phase germanium compound increases, while the concentration of the silicon compound remains constant. In other embodiments, the concentration of the silicon compound decreases. The temperature at which the deposition is carried out may be held constant or may be varied. In one embodiment the temperature is graded, and decreases as the deposition proceeds.

In some embodiments the CVD process additionally comprises at least one constant SiGe deposition phase in which the substrate is contacted with a vapor phase silicon compound and a vapor phase germanium compound to deposit SiGe with a constant composition. In one embodiment the concentrations of the silicon compound and germanium compound remain constant during the constant SiGe deposition phase.

Preferred silicon precursors include, without limitation, silane, disilane, trisilane, dichlorosilane, trichlorosilane and tetrachlorosilane. Preferred germanium precursors include, without limitation, germane, digermane and germanium tetrachloride.

The substrate may comprise, for example, a bulk silicon layer or an epitaxially deposited silicon layer.

In some embodiments, the temperature is held constant throughout the deposition process, while in other embodiments the temperature is varied. Preferably the temperature is between about 700° C. and about 1100° C.

DETAILED DESCRIPTION OF THE PREFERRED EMBODIMENT

Figure 1:
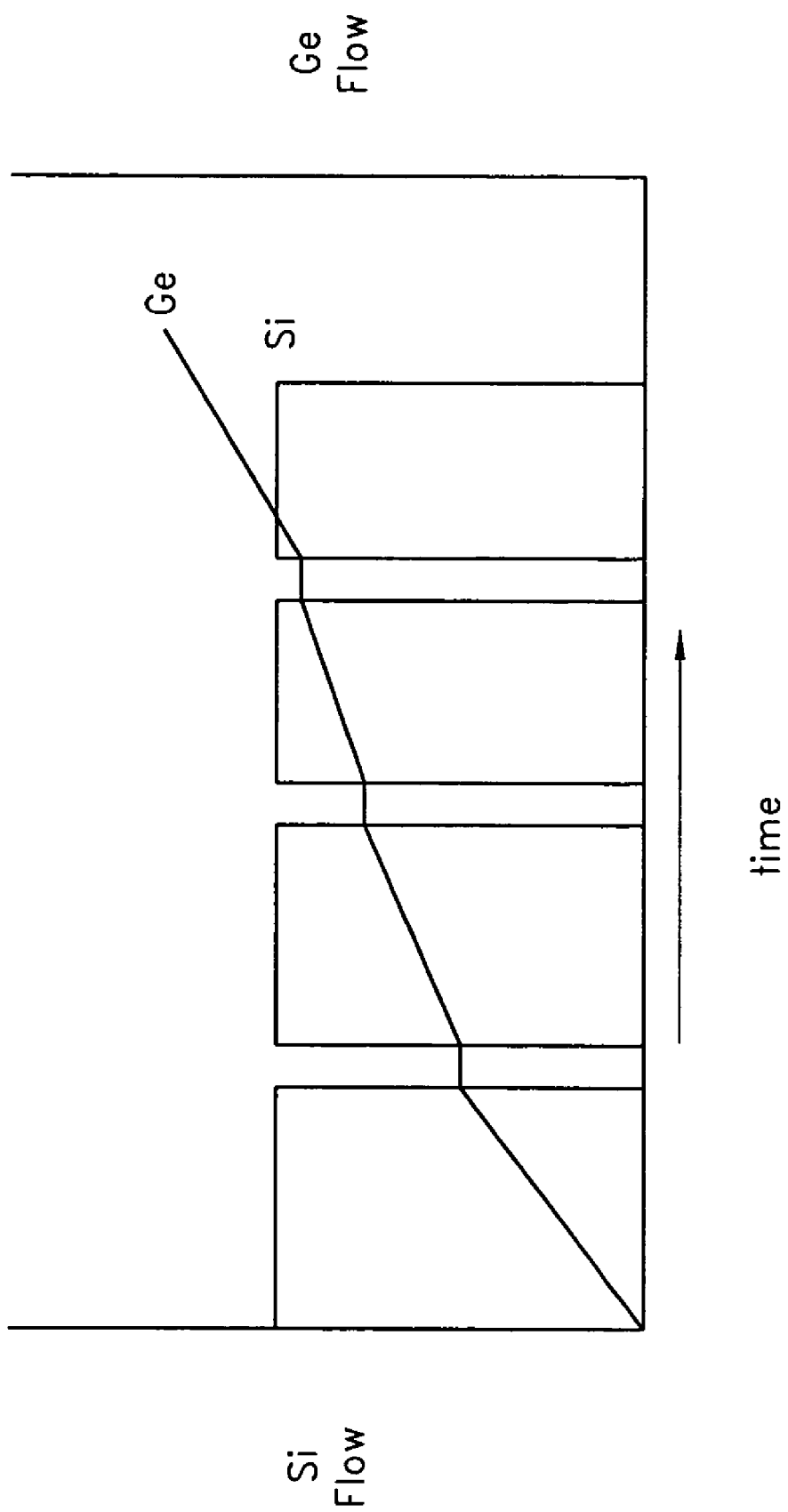
FIG. 1 is a graph plotting silicon and germanium precursor flow against time, illustrating a process for forming a graded SiGe buffer layer comprising interruptions in the silicon precursor flow.

The use of graded SiGe layers is well-known in the art. As mentioned above, to improve device performance, strained semiconductor layers are increasingly used. Typically, a "virtual substrate" comprises a layer of strained semiconductor material, preferably silicon, which has been formed by deposition over a strain relaxed buffer layer, which in turn overlies an epitaxial silicon substrate. The buffer layer is preferably SiGe, although other materials that relax with a lattice constant that is larger or smaller than Si may be used as well.

Methods have now been discovered for making relaxed SiGe films having a relatively low number of vertically propagating or threading dislocations. Although generally described below in terms of the formation of a relaxed SiGe layer on a bulk silicon substrate, one of skill in the art will recognize that the methods described herein can be applied to other contexts, such as the formation of relaxed SiGe layers on SOI substrates, and to other materials. "Substrate," as used herein, can refer to a bare wafer or to a workpiece with layers already formed on it. Consistent with this definition, the epitaxial silicon layer on which a SiGe buffer layer is deposited can be the surface of a bulk substrate, while in other embodiments an epitaxial silicon layer has been previously deposited on a substrate.

Strain relaxed buffer layers, preferably thick graded SiGe layers, can be formed with reduced defect density compared to conventional buffer layers by interrupting SiGe deposition one or more times. SiGe deposition is interrupted by briefly stopping the flow of the Si precursor to the substrate, typically for less than about 5 seconds, while the germanium precursor continues to flow during the interruption. The interruption results in an interface between the SiGe deposited prior to and subsequent to the interruption. Depending on the particular process conditions, the interruption may or may not form a layer comprising Ge but not Si.

Preferably the pile-up count in buffer layers deposited by a process comprising one or more interruptions in silicon precursor flow to the substrate is reduced from about 3 to 10 times compared to conventional buffer layers. Without being held to a particular theory, it is believed that the preferred processes reduce defects, particularly vertical threading dislocations, by gliding them from the buffer layer. This reduces the tendency of TDD's to form pile-ups at the edge of the wafer.

A semiconductor layer, preferably of silicon, may be subsequently deposited over the graded buffer. Because the lattice constant of the underlying strain-relaxed SiGe buffer layer is different from that of silicon, the subsequently deposited silicon layer can be strained, if desired.

Those skilled in the art will understand that terms such as "silicon," "silicon-germanium," "Si," and "SiGe," are terms of art used to show that the material comprises the indicated elements, and are not to be construed as limiting the relative proportions of those elements nor as excluding the presence of other elements. Thus, for example, a "SiGe" film may contain Si and Ge in various proportions and may contain other elements as well, e.g., electrically active dopants such as antimony, boron, arsenic and phosphorous.

The SiGe buffer layer may be strained initially, e.g., because it has a larger lattice constant than Si but the actual crystal is forced to align with the underlying unstrained single crystal Si structure. Ultimately, the SiGe layer is relaxed, such as by heating or deposition beyond the critical thickness, so that it adopts its natural lattice constant, which is higher than the underlying unstrained epitaxial Si layer.

The SiGe buffer layer may be deposited by any method known in the art. Preferably, deposition is by a chemical vapor deposition (CVD) type process. Well known methods exist for such heteroepitaxial deposition methods, ranging from batch, furnace-based low pressure CVD (LPCVD) to single-wafer, cold-wall chamber based rapid thermal chemical vapor deposition (RTCVD) processes. In some embodiments, SiGe deposition is conducted at very low pressures by Ultra High Vacuum Chemical Vapor Deposition (UHVCVD) or Molecular Beam Epitaxy (MBE).

In preferred embodiments, a SiGe film is deposited on a substrate from a germanium precursor and a silicon precursor by chemical vapor deposition (CVD). The CVD may take place in a single wafer, cold wall, single pass laminar flow reactor such as the Epsilon™ CVD reactor available from ASM America. Routine experimentation can be used to determine the deposition conditions (e.g., deposition temperature and deposition pressure) for any particular $Si_{1-x}Ge_x$ layer. In the case of a single wafer chamber the pressure is preferably in the range of about 1 Torr to atmospheric pressure, more preferably about 10 Torr to 100 Torr.

The deposition process may employ any silicon precursors, germanium precursors and carrier gases and may be performed under a variety of temperatures, pressures and flow rates. Preferred silicon precursors include, without limitation, silane, disilane, trisilane, dichlorosilane (DCS), trichlorosilane, and tetrachlorosilane. In some particular embodiments, DCS is preferably used. Germanium precursors include, without limitation, $GeCl_4$, $GeH_4$ and digermane. Other silicon and germanium precursors that may be used will be apparent to one of skill in the art. The optimal precursors and reaction conditions can be readily determined by the skilled artisan for a particular application without undue experimentation.

In some embodiments, a carrier gas, such as $H_2$, is flowed through the chamber continuously during the deposition process, for example at a flow rate of about 1.0 slm to about 100 slm. In one preferred embodiment the concentration of germanium precursor, such as $GeH_4$, is about 10% in the main carrier gas. The flow rate of the carrier gas may be varied to produce the desired Ge gradation profile based on the preferred flow of DCS being used, as can be determined by the skilled artisan based on the particular circumstances.

The skilled artisan can also select the appropriate deposition temperature to ensure the optimum deposition rate based on the particular circumstances, such as the nature of the germanium and silicon precursors being used. In some embodiments the temperature is constant throughout the deposition process. Preferably the temperature is between about 700° C. and about 1100° C. For example, in some embodiments the SiGe buffer layer is deposited from dichlorosilane (DCS) and germanium tetrachloride and the temperature is held constant at about 1050° C. throughout the deposition process. In another embodiments the SiGe buffer layer is deposited from DCS and germane and the temperature is held constant at about 900° C.

In still other embodiments, the temperature is varied during the deposition process. For example, the temperature may be graded, either increasing or decreasing, over the course of the deposition. In some embodiments the temperature is graded to deposit a film with an increasing concentration of germanium and/or a decreasing concentration of silicon. In particular embodiments a decreasing graded temperature is utilized. For example, during deposition of a SiGe buffer from germane and DCS, the temperature may be graded from about 900° C. to about 700° C., more preferably from about 900° C. to about 800° C. Again, the skilled artisan can select the appropriate temperature(s) for a particular application with routine experimentation.

The pressure in the reaction chamber during deposition is also not limited and the optimum pressure can be readily determined by the skilled artisan based on the particular circumstances. In some embodiments the pressure is atmospheric pressure. In other embodiments a reduced pressure process is used, with a pressure of between about 1 and about 100 torr, more preferably between about 50 and 100 torr, and still more preferably about 80 torr. In still other embodiments, such as when ultra high vacuum CVD is employed, the pressure is preferably below about 1 torr.

The SiGe buffer layer may comprise a constant composition or may be graded. The SiGe buffer is preferably graded from a lower Ge content at a lower interface to a higher Ge content at an upper interface. In some embodiments the buffer layer is linearly graded across its thickness. However, in other embodiments the gradation profile is not linear. For example, in some preferred embodiments a graded layer may comprise one or more regions of constant composition.

Although discussed herein primarily in terms of varying the flow of the germanium and/or silicon precursors into the reaction chamber, one of skill in the art will recognize that grading of the SiGe layer can be accomplished by any method known in the art, including, without limitation, adjusting the deposition temperature, adjusting the deposition pressure, adjusting relative Ge- and Si-precursor flows, or by a combination of the three. For example, for a high Ge content, low temperatures are preferably used to avoid islanding, and high pressure (e.g., 100 Torr) may be employed. Where lower Ge content is desired, for some reactant combinations (e.g., DCS and $GeH_4$) temperature is preferably increased and pressure decreased (to, e.g., 20 Torr) during the deposition to grade the SiGe composition. In preferred embodiments, the relative concentrations of Si and Ge in the buffer layer are controlled by varying the flow of the germanium and silicon precursors.

Preferably, at the substrate/SiGe interface the SiGe layer comprises between about 0% and about 10% Ge. In some embodiments the Ge concentration of the SiGe film at the substrate/SiGe interface is less than or equal to about 10% Ge, more preferably less than or equal to about 5% Ge, yet more preferably less than or equal to about 2% Ge. In one embodiment the SiGe film comprises about 1% Ge at the substrate/SiGe interface. While the Ge concentration at the substrate/SiGe interface is typically less than about 10%, higher concentrations are possible.

The Ge concentration at the surface of the SiGe buffer is preferably higher than the Ge concentration at the substrate/SiGe interface, and may be as high as 50% or more. In one embodiment the SiGe film comprises between about 10% and about 50% Ge at the surface, more preferably about 20% to about 40%. The grading profile may be selected to minimize defect formation. As discussed above, in some embodiments the grading profile will reflect a SiGe layer with a linear change in the concentration of Ge, while in other embodiments the grading profile will reflect a SiGe layer comprising one or more regions with a graded Ge concentration and one or more regions with a constant composition. One who is skilled in the art will be able to optimize the gradation profile, and hence the composition of the buffer layer, without undue experimentation in view of the disclosure herein.

In other embodiments the entire SiGe layer has a constant composition. In one such embodiment, the SiGe buffer layer comprises about 50% silicon and about 50% germanium ($Si_{0.5}Ge_{0.5}$).

As illustrated in FIG. 1, at one or more points during the deposition process, SiGe deposition is interrupted by stopping the flow of the silicon precursor to the substrate while continuing to flow the germanium precursor. In other words, in preferred deposition processes the germanium precursor flows continuously to the reaction space while the silicon precursor is provided intermittently. This may be accomplished, for example, by venting the flow of silicon precursor away from the reaction space. In other embodiments the flow of silicon precursor is turned off.

Interrupting the flow of silicon to the reaction chamber while continuing to flow the germanium precursor leads to formation of an interface in the buffer between the SiGe deposited prior to the interruption and the SiGe deposited after the interruption. The interface may or may not comprise a pure germanium layer. Preferably the thickness of the interface is less than about 500 Å, more preferably less than about 200 Å, still more preferably less than about 100 Å and yet more preferably less than about 50 Å.

The time for which the silicon precursor flow to the substrate is interrupted may be varied depending on the particular reaction conditions, including pressure, reactant concentration and temperature. However, the silicon precursor flow is preferably interrupted for a time that is greater than the residence time of the silicon precursor in the reaction chamber. In this way, at least some germanium precursor is flowing into the chamber in the absence of available silicon precursor. However, the residence time of the germanium precursor will not be long enough to have a pure germanium and carrier gas environment in the whole chamber.

Under typical reaction conditions, for example deposition from DCS and germane at 900° C. and 80 torr, the silicon precursor flow to the reaction space is preferably interrupted for less than about 10 seconds, more preferably for less than about 5 seconds and yet more preferably for between about 0.1 seconds and 4 seconds. In one embodiment the silicon flow is interrupted for about 2 seconds, while in other embodiments the silicon flow is interrupted for about 1 second.

In one particular embodiment, $H_2$ is used as a carrier gas and is provided at a flow rate of 40 to 80 lts/min. The reaction chamber volume is about 8 liters and silicon flow is interrupted while continuing germanium precursor flow (such as $GeCl_4$) for about 0.9 seconds to 3.4 seconds.

One or more interruptions can be provided during the process of depositing the buffer layer. If more than one interruption is utilized in a particular deposition process, the time for each interruption can be independently determined. Thus, the time of each interruption in a particular process may differ. Preferably two or more interruptions are provided at regular intervals. After each interruption, the silicon precursor flow is resumed, thus leading to resumption of SiGe deposition.

In some embodiments, interruption phases 50 are provided after about 4 to 7% of the SiGe layer has been deposited and after about 10 and 15% of the SiGe layer has been deposited. Additional interruption phases 50 can be provided.

While the SiGe gradation profile may have various shapes, as discussed above, in preferred embodiments the shape reflects a Ge concentration at the top of the film that is higher than the Ge concentration at the bottom of the film. In some embodiments, the gradation profile is essentially linear in each stage and substantially linear over the thickness of the buffer layer. Several deposition processes are illustrated in FIGS. 2-6. These figures are not drawn to scale and thus are not indicative of the relationship between the time of the interruption phases 50 and the time of the SiGe deposition phases 10. Further, the peaks corresponding to the interruption phases 50 indicate germanium precursor flow in the absence of silicon precursor flow. They do not, however, indicate deposition of pure Ge, but only the formation of an interface between two SiGe deposition phases 10. Nevertheless, deposition of pure germanium during the interruption phases 50 is possible. For example, at high deposition temperatures Ge from the interruption phase is likely to diffuse into the overlying and underlying SiGe layer, while at lower temperature a more pure germanium layer may be produced during the interruption phase.

Figure 2:
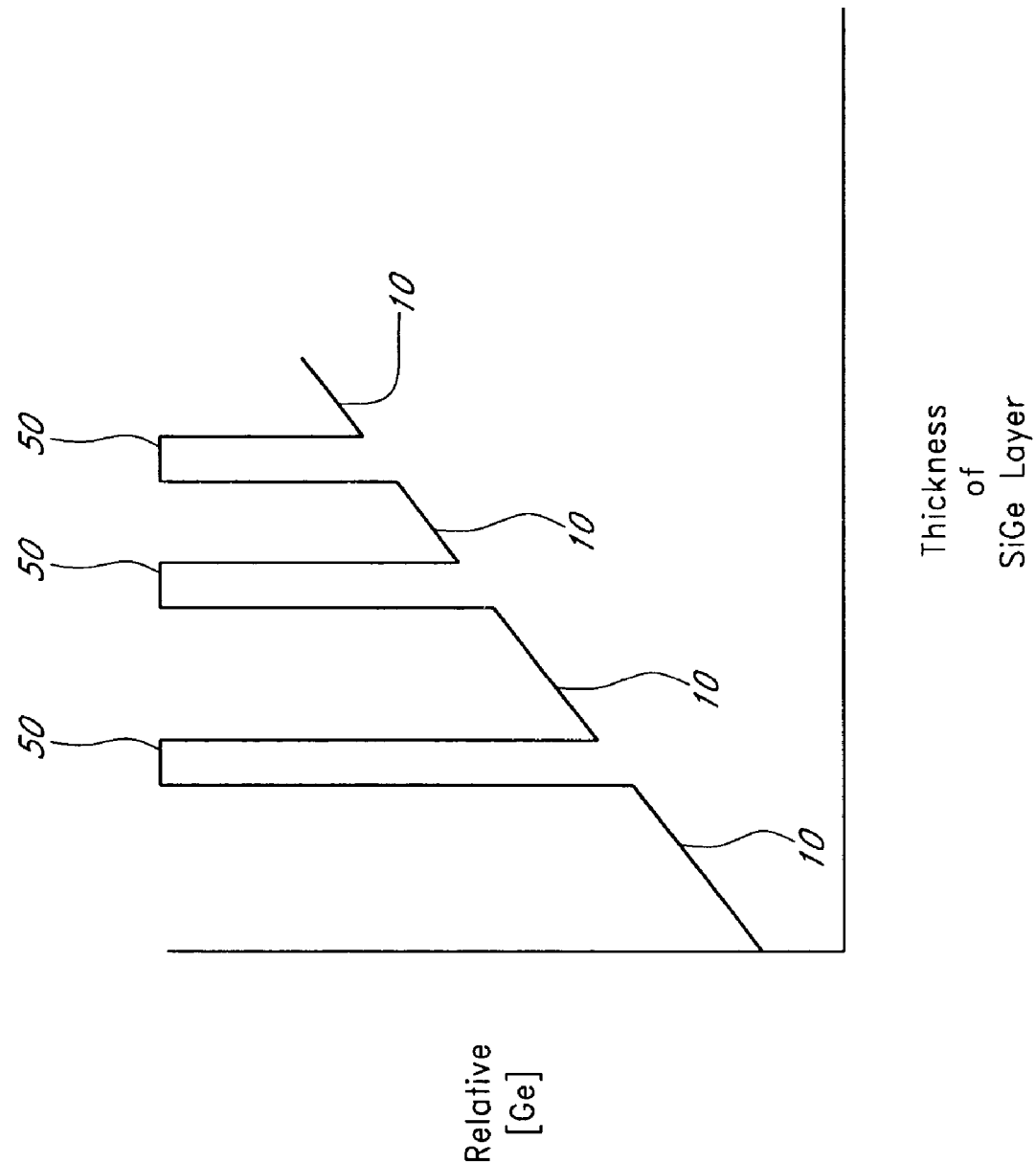
FIG. 2 is a graph plotting the relative proportion of germanium precursor flow against time, illustrating a process for depositing a linearly graded SiGe buffer layer from a silicon precursor and a germanium precursor. The graph is not drawn to scale.

A linearly graded SiGe buffer layer can be deposited by CVD from a silicon precursor and a germanium precursor, such as DCS and $GeH_4$ or DCS and $GeCl_4$. The deposition process preferably comprises two or more SiGe deposition phases 10 and one or more interruption phases 50, as illustrated in FIG. 2. In the embodiment shown in FIG. 2, during the SiGe deposition phases 10 of the deposition proces, the flow of silicon precursor is maintained at a constant level, while the flow of germanium precursor increases linearly. Each SiGe deposition phase 10 in the deposition process produces a graded portion of the buffer layer comprising a germanium concentration that increases linearly across the thickness of that portion.

In a particular embodiment, during the SiGe deposition phase 10 from about 4000 Å to about 10000 Å of SiGe is preferably deposited. The grade rate during the SiGe deposition phase is approximately 1000 Å/% of germanium and the growth rate is on the order of 1000-1500 Å per minute.

In other embodiments, the SiGe deposition phases 10 preferably continue for about 1 to about 10 minutes or more, depending on the total thickness of the SiGe buffer layer to be deposited and the process conditions, more preferably from about 1 to about 2 minutes.

During the interruption phases 50 of the deposition process, silicon germanium deposition is interrupted by stopping flow of the silicon precursor. In these interruption phases 50, the germanium precursor continues to flow, preferably at the highest flow rate achieved during the preceding SiGe deposition phase. However, in some embodiments the Ge flow rate continues to increase linearly during the interruption phase, preferably at the same rate as during the preceding SiGe deposition phase. Each interruption phase 50 results in an interface within the buffer layer. Each interruption phase 50 preferably comprises turning off the flow of the Si precursor for about 1 to about 10 seconds, more preferably from about 1 to about 2 seconds.

The SiGe deposition phases and interruption phases are repeated until a buffer layer of the desired thickness is has been formed. The buffer layer is preferably thick enough that it relaxes. The deposition process preferably begins and ends with a SiGe deposition phase 50.

In the deposition process illustrated in FIG. 2, a SiGe buffer layer with a linearly graded Ge concentration is deposited by a process comprising four SiGe deposition phases 10 in which a constant flow of silicon precursor is provided along with a linearly increasing flow of germanium precursor. The SiGe deposition phases 10 are separated by three interruption phases 50 in which only the germanium precursor is provided.

In other embodiments, a SiGe buffer layer is deposited in which the gradation profile comprises both linear phases in which the concentration of germanium increases at a steady rate and constant composition phases in which the concentration of germanium and silicon remains constant. In the deposition processes for producing such buffer layers, for example the process illustrated in FIG. 3, two or more distinct SiGe deposition phases are utilized in conjunction with one or more interruptions.

In the illustrated embodiment, a graded SiGe deposition phase 20 is followed by a constant SiGe deposition phase 30. During the graded SiGe deposition phase 20, the flow of silicon precursor can be maintained at a constant level, while the flow of germanium precursor increases linearly. Each graded SiGe deposition phase 20 in the deposition process produces a graded portion of the buffer layer comprising a germanium concentration that increases linearly. During the constant SiGe deposition phases 30 the flow of both the silicon precursor and the germanium precursor can be held constant. Thus, each constant SiGe deposition phase 30 produces a portion of the buffer layer comprising a constant concentration of both Si and Ge.

The deposition process also includes one or more interruption phases 50, in which silicon germanium deposition is interrupted by stopping flow of the silicon precursor. In these interruption phases 50, the germanium precursor continues to flow, preferably at the highest flow rate achieved during the preceding SiGe deposition phase, resulting in an interface in the buffer layer. Preferably the interface comprises less than about 3 monolayers of germanium. Each interruption phase preferably continues for about 1 to about 10 seconds, more preferably from about 1 to about 2 seconds.

The order of the constant SiGe deposition phases 30, graded SiGe deposition phases 20 and interruption phases 50 can be varied to produce a SiGe buffer layer with the desired structure. Preferably the deposition process does not begin or end with an interruption phase 50, but rather with either a graded SiGe deposition phase 20 or a constant SiGe deposition phase 30. More preferably, the deposition process begins with a graded SiGe deposition phase 20 and ends with a constant SiGe deposition phase 30.

Figure 3:
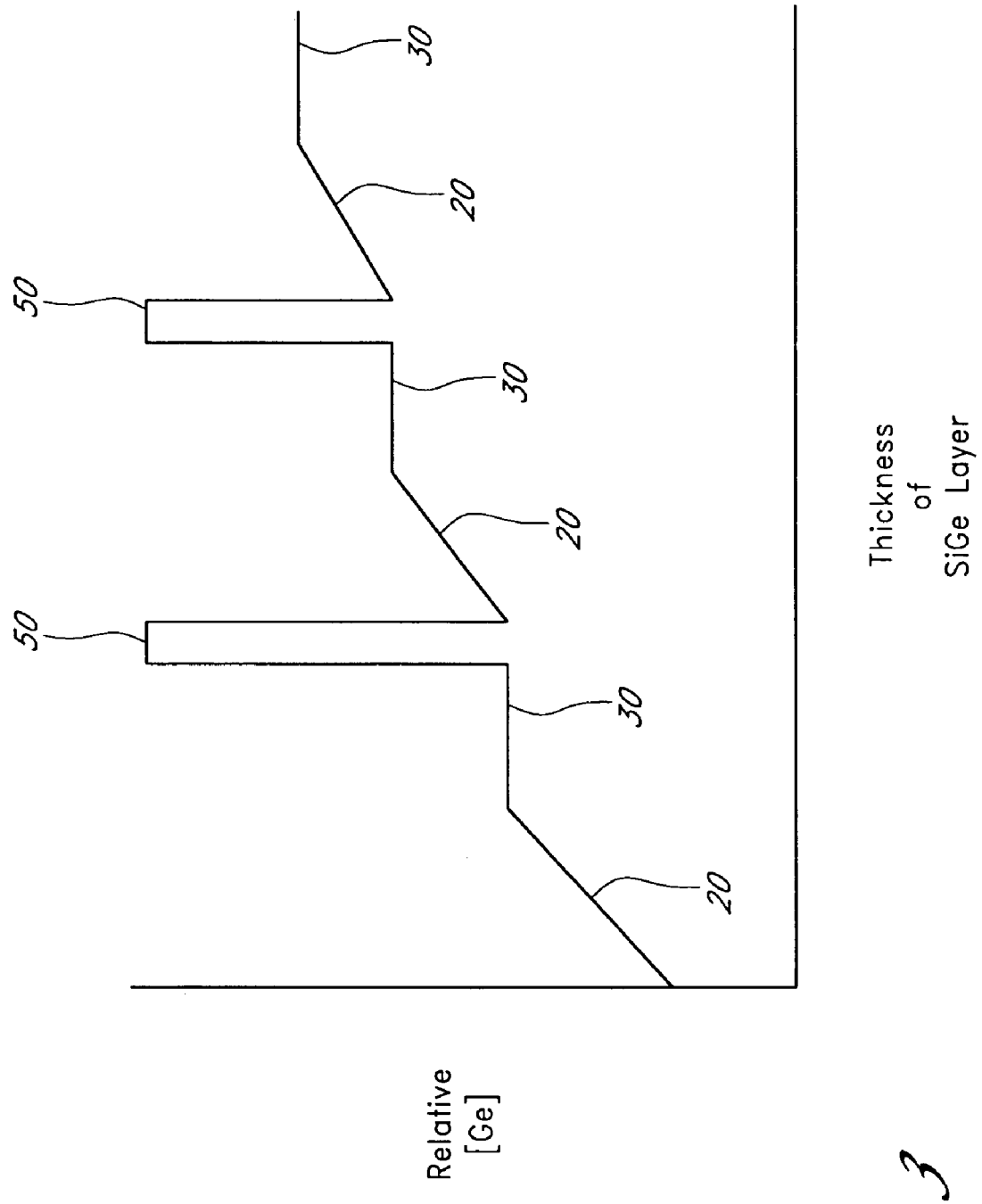
FIGS. 3-6 are graphs plotting the relative proportion of germanium precursor flow against time in various processes for depositing graded SiGe buffer layer from a silicon precursor and a germanium precursor. The processes comprise linearly graded SiGe deposition phases 20, constant SiGe deposition phases 30 and interruption phases 50. The graph is not drawn to scale. Thus, the interruption phases 50 indicate that the silicon precursor flow is interrupted while the germanium precursor flow continues but are not intended to suggest that pure germanium is deposited during the interruption phase, although such deposition is possible.

In the embodiment illustrated in FIG. 3, the deposition process begins with a graded SiGe deposition phase 20, followed by a constant SiGe deposition phase 30 and an interruption phase 50. These three phases are repeated twice, but in practice can be repeated any number of times, to achieve a SiGe buffer layer of the desired thickness. As shown in FIG. 3, the process preferably ends with a graded SiGe deposition phase 20, followed by a constant SiGe deposition phase 30.

Figure 4:
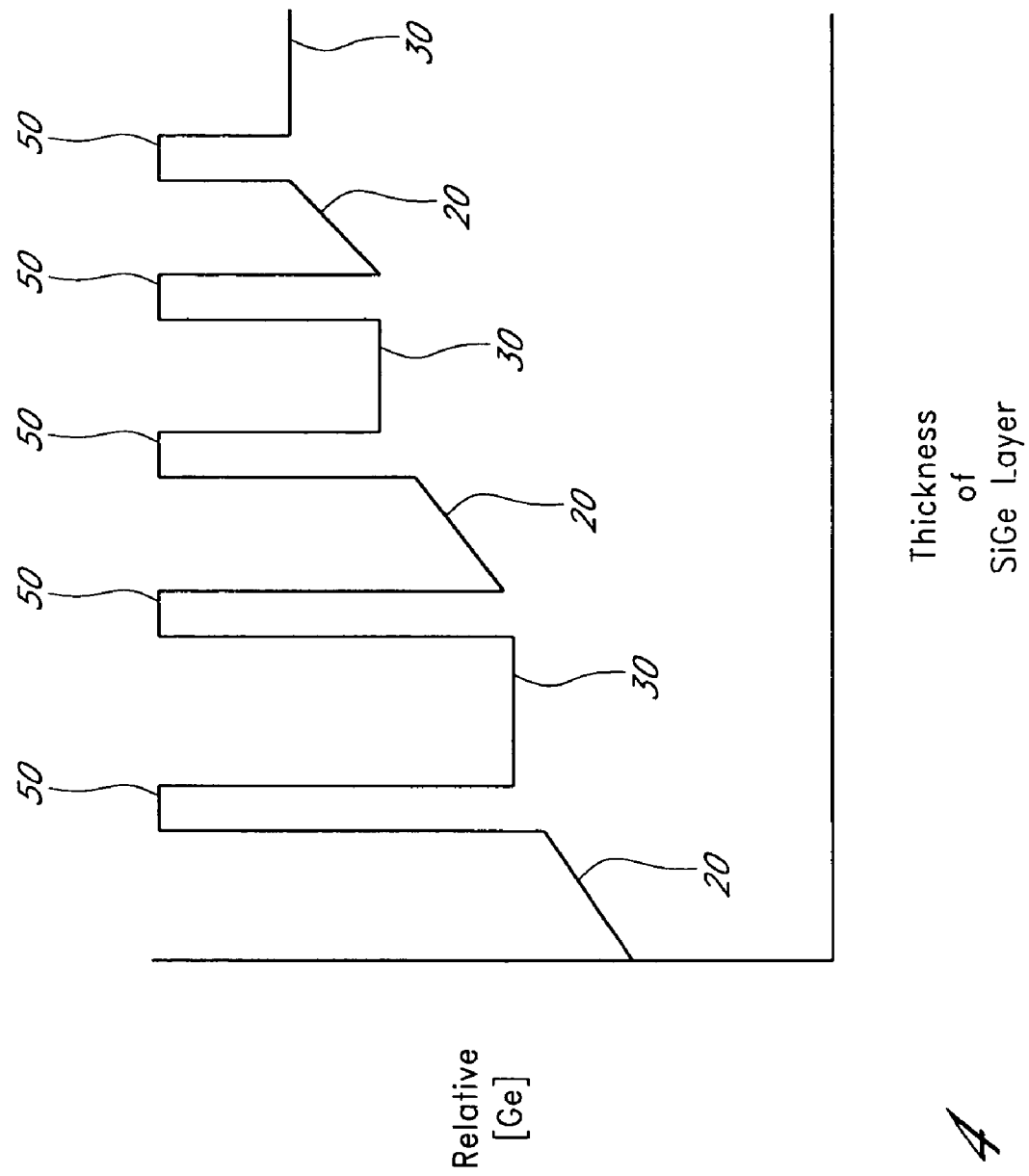

In other embodiments, such as that illustrated in FIG. 4, the deposition process comprises an interruption phase 50 between the graded SiGe deposition phase 20 and the constant SiGe deposition phase 30, rather than only after the constant SiGe deposition phase as in the embodiment illustrated in FIG. 3. Again, the process preferably ends with a constant SiGe deposition phase 30.

Figure 5:
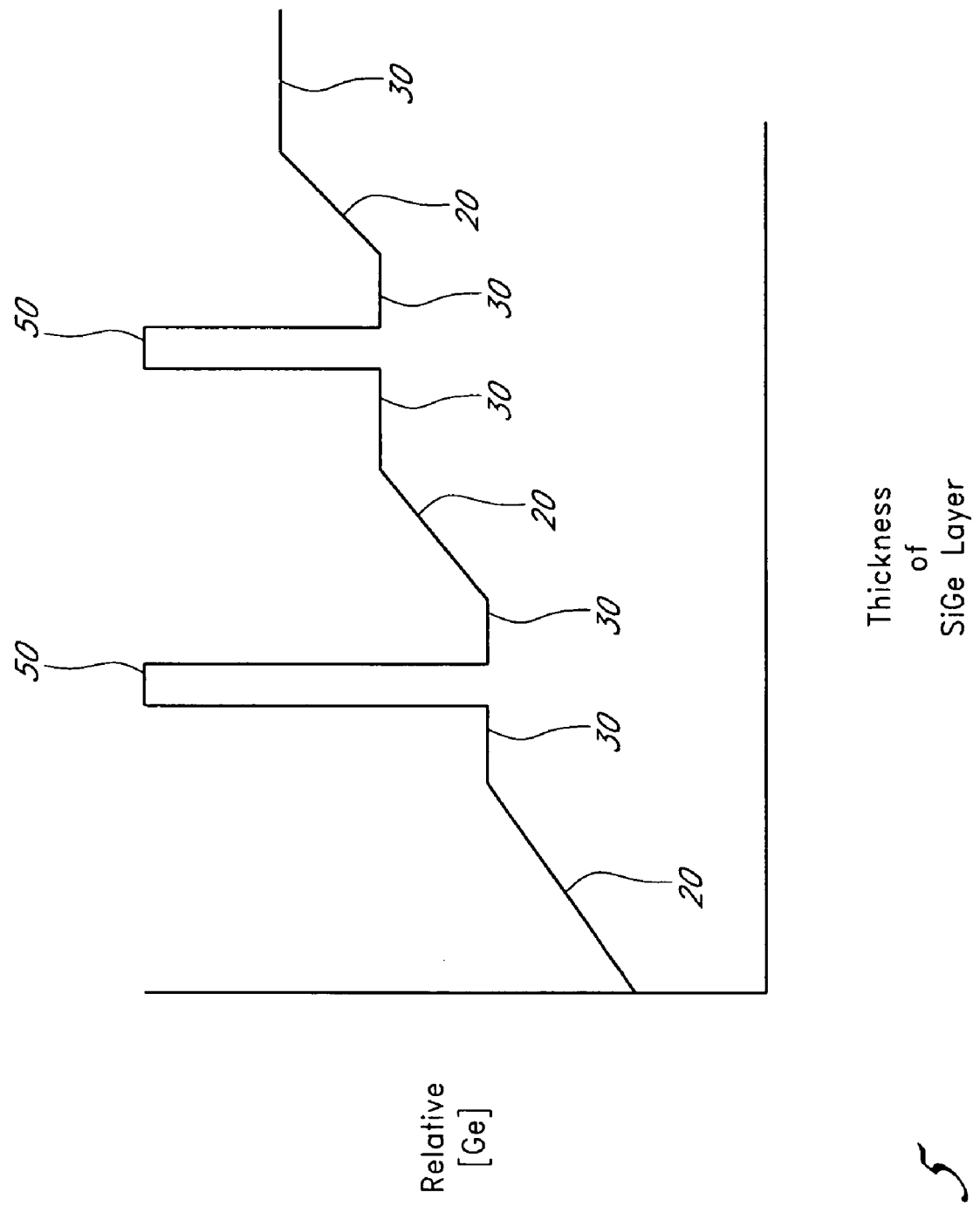
Figure 6:
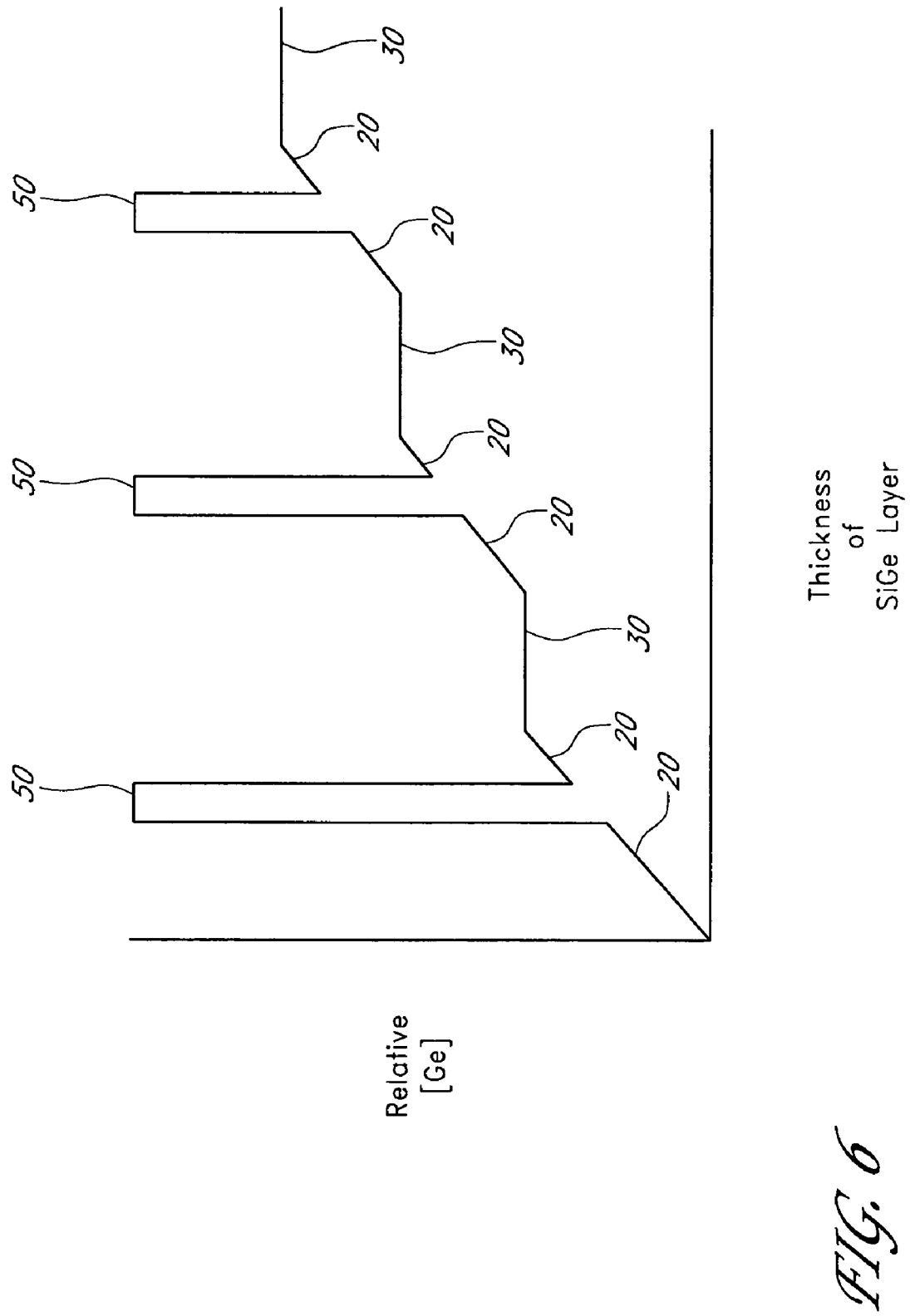

A further embodiment is illustrated in FIG. 5. In this embodiment, an interruption phase 50 is provided in the middle of a constant SiGe phase 30. That is, after an initial graded SiGe deposition phase 20, a constant SiGe deposition phase 30 is begun. After a period of time, an interruption phase 50 is carried out by turning off the flow of the Si precursor. Following the interruption phase 50, the constant SiGe deposition phase 30 is continued until another graded SiGe deposition phase 20 is begun. Similarly, in other embodiments an interruption phase may be provided within a linear SiGe deposition phase 20. Following the interruption phase 50, the graded SiGe deposition phase 20 is continued until a constant SiGe deposition phase 30 is begun, as illustrated in FIG. 6.

In one embodiment of the invention, an overlying Si layer is formed directly over the SiGe buffer layer. Preferably a single crystal silicon layer is heteroepitaxially deposited over the SiGe layer such that the Si layer strained to match the lattice structure of the fully relaxed SiGe layer. The Si layer is typically deposited by CVD, preferably in the same reaction space as the deposition of the SiGe layer. For example, after deposition of the SiGe layer, the flow of the germanium precursor, such as $GeH_4$, can be shut off, and a layer of single crystal silicon can be grown from the silicon precursor, for example trisilane, at the same deposition temperature. In alternative embodiments, the deposition of the Si layer can occur at a temperature different than that of the SiGe layer deposition.

The tensile strained Si layer provides improved electrical carrier mobility in devices fabricated from the structures described herein. For example, in transistor fabrication, the tensile strained Si layer allows fabrication of transistors having faster response times. In another embodiment, the relaxed SiGe layer is covered by a heteroepitaxially-grown compressive strained Ge layer. Likewise, the relaxed SiGe layer can be covered by a heteroepitaxially-grown compressive strained SiGe layer with high Ge content.

It will be appreciated by those skilled in the art that various omissions, additions and modifications may be made to the processes described above without departing from the scope of the invention, and all such modifications and changes are intended to fall within the scope of the invention, as defined by the appended claims.

EXAMPLE 1

A substrate is placed into a reaction chamber and heated to a deposition temperature, preferably about 900° C. DCS and germane are flowed to the reaction chamber for about 1 minute in a first linear SiGe deposition phase. Preferably the flow of DCS is about 20 sccm and the flow of germane increases from about 10 sccm to about 25 sccm during this linear deposition phase. In a first interruption phase, the flow of DCS is turned off and germane flow is maintained at 25 sccm for about 3 seconds.

In a second linear SiGe deposition phase, DCS is flowed into the reaction chamber at about 20 sccm and the flow of germane increases from about 25 sccm to about 40 sccm over the course of about 1 minute. In a second interruption phase, the DCS flow is stopped and the germane flow is maintained at about 40 sccm for about 2 seconds.

In the a third linear SiGe deposition phase, DCS flow is resumed at about 20 sccm and germane flow is increased from about 40 sccm to about 50 sccm over the course of about 1 minute. DCS flow is then stopped in a third interruption phase, while germane flow is maintained at about 50 sccm for about 1 second.

Finally, in a fourth and final deposition phase, DCS flow is resumed at about 20 sccm and germane flow is increased from about 50 sccm to about 58 sccm over the course of about 1 minute.

The SiGe buffer layer may be such that the layer is strain relaxed. In other embodiments, the SiGe buffer layer is caused to relax, for example by annealing.

A layer of Si is heteroepitaxially deposited over the SiGe buffer layer.

EXAMPLE 2

A SiGe buffer layer comprising two interruptions was deposited in an isothermal process at atmospheric pressure and a temperature of 1050° C. from DCS and $GeCl_4$, according to the process described in Table 1. Interruptions were provided in Step 3 and Step 7.

TABLE 1

|  | STEP: 1 | STEP: 2 | STEP: 3 | STEP: 4 | STEP: 5 |
| --- | --- | --- | --- | --- | --- |
| STEP NAME | Stabilization | 25-50 | FLAT | 50-100 | FLAT |
| DURATION (seconds) | 15 | 122 | 1.7 | 145 | 1.7 |
| TEMPERATURE (° C.) | 1050 | 1050 | 1050 | 1050 | 1050 |

TABLE 1-continued

| DEPOSIT OR VENT | VENT | DEPOSIT | DEPOSIT | DEPOSIT | DEPOSIT |
|---|---|---|---|---|---|
| $H_2$ FLOW (slm) | 60 | 60 | 60 | 60 | 60 |
| VENT_PRESSURE | ATM | ATM | ATM | ATM | ATM |
| DCS (sccm) | 50 | 50 | 50 Vented | 50 | 50 |
| Germanium Precursor (sccm; 10% Ge/90% $H_2$) | 25 | 50 (linear ramp from 25 to 50) | 50 | 100 (linear ramp from 50 to 100) | 100 |

| | STEP: 6 | STEP: 7 | STEP: 8 | STEP: 9 | STEP: 10 |
|---|---|---|---|---|---|
| STEP NAME | 100-135 | FLAT | 100-171 | FLAT | PURGE |
| DURATION (seconds) | 100 | 0.9 | 100 | 320 | 50 |
| TEMPERATURE (° C.) | 1050 | 1050 | 1050 | 1050 | Ramp down to 900 |
| DEPOSIT OR VENT | DEPOSIT | DEPOSIT | DEPOSIT | DEPOSIT | VENT |
| $H_2$ FLOW (slm) | 60 | 60 | 60 | 60 | Ramp down to 20 |
| VENT_PRESSURE | ATM | ATM | ATM | ATM | ATM |
| DCS (sccm) | 50 | 50 Vented | 50 | 50 | 0 |
| Germanium Precursor (sccm; 10% Ge/90% $H_2$) | 135 (linear ramp from 50 to 135) | 135 | 171 (linear ramp from 135 to 171) | 171 | 0 |

EXAMPLE 3

A SiGe buffer layer comprising three interruptions was deposited in an isothermal process at reduced pressure and a temperature of 1050° C. from DCS and $GeCl_4$, according to the process described in Table 2. Interruptions were provided in Steps 4, 8 and Step 12.

TABLE 2

| | STEP: 1 | STEP: 2 | STEP: 3 | STEP: 4 | STEP: 5 |
|---|---|---|---|---|---|
| STEP NAME | Stabilization | 25-75 | FLAT | FLAT | FLAT |
| DURATION (seconds) | 15 | 102 | 20 | 0.9 | 20 |
| TEMPERATURE (° C.) | 1050 | 1050 | 1050 | 1050 | 1050 |
| DEPOSIT OR VENT | VENT | DEPOSIT | DEPOSIT | DEPOSIT | DEPOSIT |
| $H_2$ FLOW (slm) | Ramp up to 70 | 70 | 70 | 70 | 70 |
| VENT_PRESSURE (torr) | 80 | 80 | 80 | 80 | 80 |
| DCS (sccm) | 85 | 85 | 85 | 85 Vent | 85 |
| Germanium Precursor (sccm; 10% Ge/90% $H_2$) | 25 | 75 (linear ramp from 25 to 75) | 75 | 75 | 75 |

| | STEP: 6 | STEP: 7 | STEP: 8 | STEP: 9 | STEP: 10 |
|---|---|---|---|---|---|
| STEP NAME | 75-150 | FLAT | FLAT | FLAT | 150-200 |
| DURATION (seconds) | 102 | 20 | 0.9 | 20 | 70 |
| TEMPERATURE (° C.) | 1050 | 1050 | 1050 | 1050 | 1050 |
| DEPOSIT OR VENT | DEPOSIT | DEPOSIT | DEPOSIT | DEPOSIT | DEPOSIT |
| $H_2$ FLOW (slm) | 70 | 70 | 70 | 70 | 70 |
| VENT_PRESSURE (torr) | 80 | 80 | 80 | 80 | 80 |
| DCS (sccm) | 85 | 85 | 85 Vent | 85 | 85 |
| Germanium Precursor (sccm; 10% Ge/90% $H_2$) | 150 (linear ramp from 75 to 150) | 150 | 150 | 150 | 200 (linear ramp from 150 to 200) |

| | STEP: 11 | STEP: 12 | STEP: 13 | STEP: 14 | STEP: 15 | STEP: 16 |
|---|---|---|---|---|---|---|
| STEP NAME | FLAT | FLAT | FLAT | 200-250 | FLAT | PURGE |
| DURATION (seconds) | 20 | 0.9 | 20 | 74 | 266 | 30 |
| TEMPERATURE (° C.) | 1050 | 1050 | 1050 | 1050 | 1050 | 900 |
| DEPOSIT OR VENT | DEPOSIT | DEPOSIT | DEPOSIT | DEPOSIT | DEPOSIT | VENT |
| $H_2$ FLOW (slm) | 70 | 70 | 70 | 70 | 70 | Ramp down to 20 |
| VENT_PRESSURE (torr) | 80 | 80 | 80 | 80 | 80 | 80 |
| DCS (sccm) | 85 | 85 Vent | 85 | 85 | 85 | 0 |
| Germanium Precursor (sccm; 10% Ge/90% $H_2$) | 200 | 200 | 200 | 250 (linear ramp from 200 to 250) | 250 | 0 |

EXAMPLE 4

A SiGe buffer layer comprising two interruptions was deposited in a variable temperature process at reduced pressure from DCS and GeH4, according to the process described in Table 3. The temperature decreased from about 900° C. to about 800° C. over the course of the deposition process. Interruptions were provided in Steps 4 and 8.

TABLE 3

|  | STEP: 1 | STEP: 2 | STEP: 3 | STEP: 4 | STEP: 5 |
|---|---|---|---|---|---|
| STEP NAME | PURGE | RAMP (5-10%) | FLAT | FLAT | FLAT |
| DURATION (min:seconds) | 60 | 4:30 | 1:00 | 5 | 1:00 |
| TEMPERATURE (° C.) | 900 | Ramp to 850 | 850 | 850 | 850 |
| DEPOSIT OR VENT | VENT | DEPOSIT | DEPOSIT | DEPOSIT | DEPOSIT |
| $H_2$ FLOW (slm) | 40 | 40 | 40 | 40 | 40 |
| VENT_PRESSURE (torr) | 80 | 80 | 80 | 80 | 80 |
| DCS (sccm) | 20 | 20 | 20 | 20 Vent | 20 |
| $GeH_4$ (sccm) | 2 | 15 (ramp from 2 to 15) | 15 | 15 | 15 |

|  | STEP: 6 | STEP: 7 | STEP: 8 | STEP: 9 | STEP: 10 | STEP: 11 |
|---|---|---|---|---|---|---|
| STEP NAME | RAMP (10-15%) | FLAT | FLAT | FLAT | RAMP (15-20%) | FLAT |
| DURATION (seconds) | 6:45 | 1:00 | 3 | 1:00 | 6:05 | 10:30 |
| TEMPERATURE (° C.) | Ramp to 825 | 825 | 825 | 825 | Ramp to 800 | 800 |
| DEPOSIT OR VENT | DEPOSIT | DEPOSIT | DEPOSIT | DEPOSIT | DEPOSIT | DEPOSIT |
| $H_2$ FLOW (slm) | 40 | 40 | 40 | 40 | 40 | 40 |
| VENT_PRESSURE (torr) | 80 | 80 | 80 | 80 | 80 | 80 |
| DCS (sccm) | 20 | 20 | 20 Vent | 20 | 20 | 20 |
| $GeH_4$ (sccm) | 27 (ramp from 15 to 27) | 27 | 27 | 27 | 58 (ramp from 27 to 58) | 58 |

What is claimed is:

1. A chemical vapor deposition (CVD) process for forming a strain relaxed SiGe buffer layer over a semiconductor substrate in a reaction chamber comprising:
   flowing a silicon precursor and a germanium precursor into the reaction chamber to deposit SiGe in a first SiGe deposition phase;
   interrupting the flow of the silicon precursor into the reaction chamber while continuing to flow the germanium precursor into the reaction chamber in a first interruption phase; and
   resuming the flow of the silicon precursor into the reaction chamber while continuing to flow the germanium precursor into the reaction chamber to deposit SiGe in a second SiGe deposition phase, wherein the SiGe deposited in the second SiGe deposition phase comprises an increasing concentration of germanium.

2. The process of claim 1, wherein an interface layer is formed in the SiGe buffer layer in the interruption phase.

3. The process of claim 2, wherein the interface layer has a thickness of less than about 100 Å.

4. The process of claim 2, wherein the interface layer has a thickness of less than about 50 Å.

5. The process of claim 2, wherein the interface layer has a different composition than the SiGe buffer layer.

6. The process of claim 1, wherein interrupting comprises stopping the flow of the silicon precursor into the reaction space for less than about 10 seconds.

7. The process of claim 6, wherein interrupting comprises stopping the flow of the silicon precursor into the reaction space for less than about 5 seconds.

8. The process of claim 1, wherein the temperature is held constant throughout the deposition process.

9. The process of claim 8, wherein the temperature is between about 700° C. and about 1100° C.

10. The process of claim 1, wherein the temperature is varied during the deposition process.

11. The process of claim 1, wherein the silicon precursor is selected from the group consisting of silane, disilane, trisilane, dichlorosilane, trichlorosilane and tetrachlorosilane.

12. The process of claim 1, wherein the germanium precursor is selected from the group consisting of $GeCl_4$, $GeH_4$ and digermane.

13. The process of claim 1, wherein the silicon precursor is dichlorosilane and the germanium precursor is germanium tetrachloride.

14. The process of claim 1, wherein the silicon precursor is DCS and the germanium precursor is germane.

15. The process of claim 1, wherein the SiGe deposited in the first SiGe deposition phase has an increasing concentration of germanium.

16. A method for depositing a SiGe buffer layer with reduced defects on a substrate in a reaction chamber comprising continuously flowing a germanium precursor to the reaction chamber and flowing a silicon precursor to the reaction chamber, wherein the flow of the silicon precursor is interrupted one or more times, and wherein the SiGe deposited in the SiGe buffer layer after the first interruption comprises an increasing concentration of germanium.

17. The method of claim 16, wherein the substrate comprises a bulk silicon layer.

18. The method of claim 16, wherein the substrate comprises an epitaxially-deposited silicon layer.

19. The method of claim 16, wherein the SiGe buffer layer comprises an increasing concentration of germanium from a lower interface with the substrate to an upper interface with an overlying layer.

20. The method of claim 19, wherein the overlying layer is a strained silicon layer.

21. The method of claim 16, wherein the ratio of germanium precursor to silicon precursor increases while flowing the silicon precursor to the deposition chamber.

22. A method of depositing a SiGe layer on a substrate in a reaction chamber comprising:

flowing a silicon precursor and a germanium precursor into the reaction chamber simultaneously; and stopping the flow of the silicon precursor into the reaction chamber while continuing to flow the germanium precursor to deposit SiGe at one or more intervals during the deposition, wherein the SiGe deposited after stopping the flow of the silicon precursor comprises an increasing concentration of germanium.

23. The method of claim 22, wherein said one or more intervals are each less than about 10 seconds.

24. The method of claim 22, wherein the flow of the silicon precursor is stopped in at least two intervals 22 the deposition.

25. The method of claim 23, additionally comprising continuously flowing an inert carrier gas.

26. The method of claim 25, wherein the inert carrier gas is $H_2$ or $N_2$.

27. A method of forming a strained silicon layer in on a semiconductor substrate comprising:

depositing a silicon germanium buffer layer on the substrate by a chemical vapor deposition (CVD) process; and depositing a layer of strained silicon over the SiGe buffer layer, wherein the CVD process comprises at least two SiGe deposition phase in which the substrate is contacted with a vapor phase silicon compound and a vapor phase germanium compound to deposit SiGe with an increasing concentration of germanium, and at least one interruption phase in which the substrate is contacted with a vapor phase germanium compound but not a vapor phase silicon compound.

28. The method of claim 27, wherein during the SiGe deposition phase the concentration of the vapor phase germanium compound increases.

29. The method of claim 27, wherein during the SiGe deposition phase the concentration of the vapor phase silicon compound decreases.

30. The method of claim 27, wherein during the SiGe deposition phase the temperature is graded.

31. The method of claim 30, wherein the temperature is decreased during the SiGe deposition phase.

32. The method of claim 27, wherein the CVD process additionally comprises at least one constant SiGe deposition phase in which the substrate is contacted with a vapor phase silicon compound and a germanium compound to deposit SiGe with a constant composition.

33. The method of claim 32, wherein during the constant SiGe deposition phase the concentrations of the silicon precursor and the germanium precursor remain constant.

* * * * *

UNITED STATES PATENT AND TRADEMARK OFFICE
CERTIFICATE OF CORRECTION

PATENT NO.       : 7,785,995 B2                                          Page 1 of 1
APPLICATION NO.  : 11/431336
DATED            : August 31, 2010
INVENTOR(S)      : Nyles W. Cody et al.

It is certified that error appears in the above-identified patent and that said Letters Patent is hereby corrected as shown below:

On Page 1, Item 75 (Inventors), Line 4, change "Bernjn (FR)" for Carlos Mazure to --Bernin (FR)--

In Column 15, Line 12 (approximate), in claim 24, change "22" to --during--

In Column 15, Line 13 (approximate), in claim 25, change "claim 23," to --claim 22,--

In Column 15, Line 25 (approximate), in claim 27, change "phase" to --phases--

Signed and Sealed this
Seventh Day of June, 2011

David J. Kappos
*Director of the United States Patent and Trademark Office*